United States Patent [19]

Uchibori et al.

[11] Patent Number: 5,767,007
[45] Date of Patent: Jun. 16, 1998

[54] METHOD FOR FABRICATING OHMIC ELECTRODE AND MULTI-LAYERED STRUCTURE FOR OHMIC FABRICATING ELECTRODE

[75] Inventors: Chihiro Uchibori; Masanori Murakami, both of Kyoto; Akira Otsuki, Shiga; Takeo Oku, Kyoto; Masaru Wada, Kanagawa, all of Japan

[73] Assignee: Sony Corporation, Tokyo, Japan

[21] Appl. No.: 309,880

[22] Filed: Sep. 20, 1994

[30] Foreign Application Priority Data

Sep. 21, 1993 [JP] Japan .................................... 5-257657

[51] Int. Cl.$^6$ .......................... H01L 21/28; H01L 21/3205
[52] U.S. Cl. ........................... 438/604; 438/605; 438/606
[58] Field of Search .......................... 437/184, 133, 437/189, 200; 148/DIG. 1

[56] References Cited

U.S. PATENT DOCUMENTS

| | | | |
|---|---|---|---|
| 4,796,082 | 1/1989 | Murakami et al. | 437/184 |
| 4,849,802 | 7/1989 | Jackson et al. | |
| 5,027,187 | 6/1991 | O'Mara, Jr. et al. | |

OTHER PUBLICATIONS

Journal of Applied Physics, vol. 68, No. 5, Sep. 1, 1990, pp. 2475–2481, XP0000108786, "Thermally Stable Ohmic Contacts to N-Type GaAs. VIII. Sputter-Deposited InAs Contacts".

Patent Abstracts of Japan, vol. 13, No. 439, (E-827), Oct. 3, 1989, & JP 01 166556A (Hitachi Ltd.), Jun. 30, 1989.

IBM Technical Disclosure Bulletin, vol. 34, No. 1, Jun. 1, 1991, New York, U.S., pp. 130–131, XP000210152, "Thermally Stable Low Au Content Ohmic Contact/Diffusion Barrier to N-type GaAs."

Murakami et al., "Thermal Stable . . . P-Type Gallium Arsenide" Chemical Abstracts, vol. 115, No. 1, p. 19498, Jul. 1991.

Kim et al; "Thermal Stable . . . InAs Contacts", J. Appl Phys. 68(5) Sep. 1990; pp. 2475–2481.

Wright et al.; "In Situ Contacts to GaAs Based on InAs"; Appl. Phys. Lett 49(22), Dec. 1986, pp. 1545–1547.

Murakami et al; "Thermal Stable . . . NiInw Ohmic Contacts"; J. Appl. Phys 68(5), Sep. 1990, pp. 2468–2474.

*Primary Examiner*—Trung Dang
*Attorney, Agent, or Firm*—Hill & Simpson

[57] ABSTRACT

An ohmic electrode for III-V compound semiconductors such as GaAs semiconductors which has practically satisfactory characteristics is disclosed. A non-single crystal InAs layer, Ni film, WSi film and W film are sequentially deposited on an n$^+$-type GaAs substrate by sputtering, etc. and subsequently patterned by lift-off, etc. to make a multi-layered structure for fabricating ohmic electrodes. The structure is then annealed first at, e.g. 300° C. for 30 minutes and next at, e.g. 650° C. for one second to fabricate an ohmic electrode.

55 Claims, 11 Drawing Sheets

METAL | LOW ENERGY BARRIER SEMICONDUCTOR LAYER | N-TYPE III-V COMPOUND SEMICONDUCTOR SUBSTRATE

InAs(18nm)/Ni(23nm)/WSi(4nm)/W(50nm)(▲)
AS-DEP

InAs(18nm)/Ni(23nm)/WSi(4nm)/W(50nm)(▲)
300°C×30min

METHOD FOR FABRICATING OHMIC ELECTRODE AND MULTI-LAYERED STRUCTURE FOR OHMIC FABRICATING ELECTRODE

BACKGROUND OF THE INVENTION

1. Field of the Invention

This invention relates to a method for fabricating an ohmic electrode and to a multi-layered structure for fabricating an ohmic electrode suitable for, in particular, III-V compound semiconductors.

2. Description of the Related Art

Decrease in contact resistance of ohmic electrodes and improvement of their thermal stability are important issues for implementation of high performance and reliability of devices such as FETs using compound semiconductors. So far, however, no satisfactory ohmic electrodes are available for compound semiconductors, in particular, GaAs or other III-V compound semiconductors.

At present, the most frequently used material of ohmic electrodes for GaAs semiconductors is AuGe/Ni. The use of AuGe/Ni as the material of ohmic electrodes makes it possible to fabricate ohmic electrodes in ohmic contact with GaAs semiconductors by annealing at 400° to 500° C.

The most serious problem with the use of AuGe/Ni as the material of ohmic electrodes is that the thermal instability of the ohmic electrodes fabricated with the material. That is, since AuGe/Ni contains a great amount of Au (88% of typically used AuGe), Au reacts with GaAs at a temperature of or above 400° C., and makes β-AuGa (of a hexagonal close packed (HCP) structure with melting point $T_m=375°$ C.), which causes deterioration of the thermal stability even though contributing to a decrease in contact resistance of the ohmic electrode. It results in inviting deterioration of device characteristics due to high temperature processes such as chemical vapor deposition (CVD) executed after formation of the ohmic electrode.

This problem is explained below by taking a specific JFET manufacturing process with reference to FIG. 1. That is, in this manufacturing process, an n-type channel layer 102 is first formed in a semi-insulating GaAs substrate 101 as shown in FIG. 1A by selective ion implantation of an n-type impurity and subsequent annealing. Then, an insulating film 103, such as $Si_3N_4$ film, is deposited on the entire surface of the semi-insulating GaAs substrate 101, and selectively removed by etching to form an opening 103a. After that, a p-type impurity, Zn, is diffused into the n-type channel layer 102 through the opening 103a to make a $p^+$-type gate region 104. Next, as shown in FIG. 1B, after the insulating film 103 is selectively removed by etching to make openings 103b, 103c, ohmic electrodes 105, 106, 107 are fabricated on the n-type channel layer 102 accessed through the openings 103a, 103b, 103c by using AuGe/Ni as their material. Next, as shown in FIG. 1C, first-layer wirings 108, 109 respectively coupled to the ohmic electrodes 106, 107 are made. Next, as shown in FIG. 1D, an inter-layer insulating film 110, such as $Si_3N_4$ film, is deposited by a CVD method on the entire surface to provide electrical insulation from second-layer wiring, referred to later, and selectively removed by etching to make openings 110a, 110b. A high temperature near 400° C. is applied in this step of depositing the interlayer insulating film 110 by a CVD method, and deteriorates the device characteristics. To make the second-layer wiring, a resist 111, for example, is applied to the surface except for areas for contacts of the second-layer wiring. After a material for the second-layer wiring is applied on the entire surface, the resist 111 is removed. As a result, second-layer wirings 112, 113 are obtained in the form of air bridge wiring as shown in FIG. 1E.

Apart from the above-indicated problem, the use of AuGe/Ni as the material of the ohmic electrode causes β-AuGa produced by reaction between GaAs and Au. β-AuGa coarsens the surface of the ohmic electrode and makes subsequent fine working difficult.

Studies have so far been made on various materials for ohmic electrodes to overcome these problems. The most ideal approach from the viewpoint of ohmic contact is to establish ohmic contact by using metal which lowers the energy barrier at the interface with an electrode metal and does not contain a compound with a low melting point, such as β-AuGa, as shown in FIG. 2 in which $E_c$ is bottom energy of the conduction band, $E_v$ is top energy of the valence band, and $E_F$ is the Fermi energy. This structure of ohmic electrode is obtained by epitaxially growing an $In_xGa_{1-x}As$ layer as an intermediate layer with a low energy barrier on a GaAs substrate by a metallorganic chemical vapor deposition (MOCVD) method, for example, and by providing an electrode metal on the layer. However, the use of an epitaxial growth equipment, such as MOCVD apparatus, to make the structure of ohmic electrode reduces the process window and degrades the mass productivity.

There is a report, directed to solution of these problems, which proposes to make on a GaAs substrate a multi-layered structure, such as InAs/W, InAs/Ni/W, Ni/InAs/Ni/W, and so forth, by depositing the intermediate InAs layer with a low energy barrier by a sputtering method using InAs as the target and by depositing the W and Ni films by an electron beam evaporation method and to apply subsequent annealing, which is said to result in obtaining an ohmic electrode having a good thermal stability (J. Appl. Phys. 68. 2475(1990)). FIG. 3 shows one of such examples in which the ohmic electrode is fabricated by depositing an InAs layer 201 on an n-type GaAs substrate 200 by a sputtering method, then depositing a Ni film 202 and a W film 203 sequentially on the InAs layer 201, and later annealing the structure.

This method is quite excellent in mass productivity because of using a sputtering method which can make the InAs layer 201 at a high speed. In addition, since the ohmic electrode uses the W film 203 which is a refractory metal as its top layer, which permits any kind of metals like Al, Au, and so on, to be used as the material of metallization for connection to the ohmic electrode without using a barrier metal, the design allows a wide choice in the process sequence. Nevertheless, this method still involves the serious problem that impossibility of introducing an impurity as the donor into the InAs layer 201, diffusion of a slight amount of In on the W film 203 during annealing, and other like factors, disturb realization of a sufficiently low contact resistance. There is also an additional problem that diffusion of In on the W film 203 during annealing coarsens the surface of the ohmic electrode and significantly degrades its morphology.

Only having existing ohmic electrodes with unsatisfactory property for use on GaAs semiconductors, realization of an ohmic electrodes with practically satisfactory characteristics has been waited for.

OBJECTS AND SUMMARY OF THE INVENTION

It is therefore a first object of the invention to provide a method for fabricating an ohmic electrode which can easily fabricate ohmic electrodes having practically satisfactory characteristics for GaAs semiconductors and other III-V compound semiconductors, with a high productivity.

A second object of the invention is to provide a multi-layered structure with which ohmic electrodes having practically satisfactory characteristics for GaAs semiconductors and other III-V compound semiconductors can be easily fabricated.

According to a first aspect of the invention, there is provided a method for fabricating an ohmic electrode according to the invention comprises the steps of: sequentially stacking on a III-V compound semiconductor body, a non-single crystal semiconductor layer and a film of a metal or an intermetallic compound, at least one of the non-single crystal semiconductor layer and the film including an impurity behaving as a donor at least for the non-single crystal semiconductor layer, and the energy barrier between the non-single crystal semiconductor layer and the film being lower than the energy barrier between the III-V compound semiconductor body and the film; and annealing the III-V compound semiconductor body provided with the non-single crystal semiconductor layer and the film.

The III-V compound semiconductor body preferably has a melting point not lower than 900° C. The III-V compound semiconductor body may be a substrate or a layer composed of, for example, GaAs, AlGaAs or InGaAs. If the III-V compound semiconductor body is of an n-type, it includes, for example, Si, Ge, Te or Sn as a donor impurity. The donor impurity is introduced into the III-V compound semiconductor body by, for example, ion implantation, liquid phase epitaxy (LPE), molecular beam epitaxy (MBE) or metallorganic vapor phase epitaxy (MOVPE).

The non-single crystal semiconductor layer preferably has a melting point not lower than 900° C. The non-single crystal semiconductor layer may be a non-single crystal InAs layer or a non-single crystal InGaAs layer. The term "non-single crystal" herein pertains to polycrystalline or amorphous materials other than single crystal materials. The non-single crystal semiconductor layer is preferably made by a sputtering method, but may also be made by another method such as a vacuum evaporation method, in particular, an electron beam evaporation method. When the non-single crystal semiconductor layer is made by a sputtering method, either a normal sputtering method using a single target of the same semiconductor material as that of the non-single crystal semiconductor layer, or a co-sputtering method using a plurality of targets containing respective elements of the non-single crystal semiconductor layer may be employed. When a single target is used, the target includes an impurity behaving as a donor for the non-single crystal semiconductor layer is used. When a plurality of targets are used, at least one of the targets includes an impurity behaving as a donor for the non-single crystal semiconductor layer. As a result, the non-single crystal semiconductor layer containing an impurity behaving as a donor can be formed.

A metal film, such as Ni film, may be provided between the III-V compound semiconductor body and the non-single crystal semiconductor layer for the purpose, among others, of improving the affinity of the non-single crystal semiconductor layer to the III-V compound semiconductor body. The metal film may include an impurity behaving as a donor for the non-single crystal semiconductor layer.

In one embodiment of the ohmic electrode fabricating method according to the invention, the film on the non-single crystal semiconductor layer comprises a metal film and a refractory metal silicide film provided on the metal film. In this case, the metal film is used for the purpose, among others, of annealing at a lower temperature to make an ohmic electrode with a low contact resistance. The refractory metal silicide film is used as an impurity diffusion source for diffusing Si contained therein into the non-single crystal semiconductor layer as an impurity behaving as a donor for the non-single crystal semiconductor layer and also for the purpose of preventing elements constituting the non-single crystal semiconductor layer, e.g. In, from diffusing toward the electrode surface during annealing. For one or other reasons, such as reducing the sheet resistance of the ohmic electrode or permitting metal wiring to be connected to the ohmic electrode without the need for a barrier metal, there is preferably provided, on the refractory metal silicide film, a refractory metal film having a lower resistivity than that of the refractory metal silicide film and unlikely to react on a material used for wiring. The metal film may be a Ni film or a Co film. The refractory metal silicide film may be a WSi film, or other film such as MoSi film, TaSi film, and so on. The refractory metal film may be a W film, or other film such as Mo film, Ta film, and so on.

In another embodiment of the ohmic electrode fabricating method according to the invention, the film on the non-single crystal semiconductor layer comprises a metal film containing an impurity behaving as a donor at least for the non-single crystal semiconductor layer and a refractory metal film provided on the metal film. In this case, the metal film containing an impurity behaving as a donor at least for the non-single crystal semiconductor layer is used for the purpose of annealing at a lower temperature so as to make an ohmic electrode with a low contact resistance and for making it behaves as an impurity diffusion source for diffusing in the non-single crystal semiconductor layer an impurity behaving as a donor therefor. The refractory metal film is used for the purposes, among others, of reducing the sheet resistance of the ohmic electrode and permitting metal wiring to be connected to the ohmic electrode without the need for a barrier metal. The metal film may be a Ni film or a Co film. The refractory metal film may be a W film, or other film such as Mo film, Ta film, and so on.

In another embodiment of the ohmic electrode fabricating method according to the invention, the film on the non-single crystal semiconductor layer comprises a metal film, a film comprising an impurity behaving as a donor at least for the non-single crystal semiconductor layer and a refractory metal film provided on this film. In this case, the metal film is used for the purpose, among others, of annealing at a lower temperature so as to make an ohmic electrode with a low contact resistance. The film comprising an impurity behaving as a donor at least for the non-single crystal semiconductor layer is used as an impurity diffusion source for diffusing in the non-single crystal semiconductor layer an impurity behaving as a donor therefor. The refractory metal film is used for the purposes, among others, of reducing the sheet resistance of the ohmic electrode and permitting metal wiring to be connected to the ohmic electrode without the need for a barrier metal. The metal film may be a Ni film or a Co film. The refractory metal film may be a W film, or other film such as Mo film, Ta film, and so on.

In another embodiment of the ohmic electrode fabricating method according to the invention, the non-single crystal semiconductor layer contains an impurity behaving as a donor at least for itself, and the film on the non-single crystal semiconductor layer comprises a metal film and a refractory metal film provided thereon. In this case, the metal film is used for the purpose, among others, of annealing at a lower temperature so as to make an ohmic electrode with a low contact resistance. The refractory metal film is used for the purposes, among others, of reducing the sheet resistance of the ohmic electrode and permitting metal wiring to be connected to the ohmic electrode without the need for a barrier metal. The metal film may be a Ni film or a Co film. The refractory metal film may be a W film, or other film such as Mo film, Ta film, and so on.

If preferable from the viewpoint of reducing the sheet resistance of the ohmic electrode, an additional film such as Al film, Au film, Au/Ti film, and so on, may be provided on the refractory metal film.

The films on the non-single crystal semiconductor layer, i.e. the metal film, the refractory metal silicide film, the refractory metal film, and so on, may be made by a sputtering method or a vacuum evaporation method, in particular, electron beam evaporation method. In case of making these metal film, refractory metal silicide film, and refractory metal film by a sputtering method, either a normal sputtering method using a single target of the same material as that of one of these films, or a co-sputtering method using a plurality of targets containing respective elements constituting one of these films may be employed. In case of making these metal film, refractory metal silicide film and metal refractory film by a vacuum evaporation method, either a single evaporation source comprising the same material as that of one of these films or a plurality of evaporation sources each comprising respective elements constituting one of these films may be used. The refractory metal film may be made by a CVD method in some cases.

Impurity behaving as the donor for the non-single crystal semiconductor layer may be one or more of impurities chosen from the group consisting of Si, Ge, Te and Sn. These impurities behave as donors also for the III-V compound semiconductor body.

In the ohmic electrode fabricating method according to the invention, the annealing temperature is chosen at a temperature causing crystallization of the non-single crystal semiconductor layer, preferably not higher than 900° C., considering the melting points of the III-V compound semiconductor body and the non-single crystal semiconductor layer used. The annealing is preferably conducted in two divisional steps, the first at a lower temperature than that of the second step, namely about 200° to 400° C., and the second at 500° to 900° C.

According to a second aspect of the invention, there is provided a multi-layered structure for fabricating an ohmic electrode according to the invention comprises: a non-single crystal semiconductor layer and, a film composed of a metal or an intermetallic compound which are sequentially stacked on a III-V compound semiconductor body, in which at least one of the non-single crystal semiconductor layer and the film includes an impurity behaving as a donor at least for the non-single crystal semiconductor layer, and the energy barrier between the non-single crystal semiconductor layer and the film is lower than the energy barrier between the III-V compound semiconductor body and the film.

As to requirements or preferences of the III-Vi compound semiconductor body, non-single crystal semiconductor layer, film of a metal or an intermetallic compound, impurities behaving as the donor for the non-single crystal semiconductor layer, and so on, what is stated with reference to the methods for fabricating an ohmic electrode according to the invention also applies to the ohmic electrode multi-layered structure according to the invention.

According to the ohmic electrode fabricating method according to the invention, an ohmic electrode having practically satisfactory characteristics required in a device, such as thermal stability, low contact resistance, flat of the surface, and so on, can be easily fabricated by providing a multi-layered structure for fabricating an ohmic electrode, which comprises a non-single crystal semiconductor layer and a film of a metal or an intermetallic compound, at least one of the non-single crystal semiconductor layer and the film including an impurity behaving as a donor at least for the non-single crystal semiconductor layer, and the energy barrier between the non-single crystal semiconductor layer and the film being lower than the energy barrier between the III-V compound semiconductor body and the film, and subsequently annealed. In particular, since the crystalline semiconductor layer made by crystallization of the non-single crystal semiconductor layer due to the annealing contains a donor impurity and comes to have a low resistance, the ohmic electrode obtained results in having a low contact resistance. In addition, since the multi-layered structure includes the non-single crystal semiconductor layer which can be easily made by a sputtering method with a high film making speed and behaves as the intermediate layer of a low energy barrier, the method can produce ohmic electrodes with a high productivity.

According to the multi-layered structure according to the invention, ohmic electrodes having satisfactory characteristics practically required in devices can be fabricated easily.

The above, and other, objects, features and advantage of the present invention will become readily apparent from the followings detailed description thereof which is to be read in connection with the accompanying drawings.

DETAILED DESCRIPTION OF THE PREFERRED EMBODIMENTS

Embodiments of the invention will now be described with reference to the drawings.

FIGS. 4A to 4D show a process sequence for manufacturing an ohmic electrode according to a first embodiment of the invention.

Figure 4A:
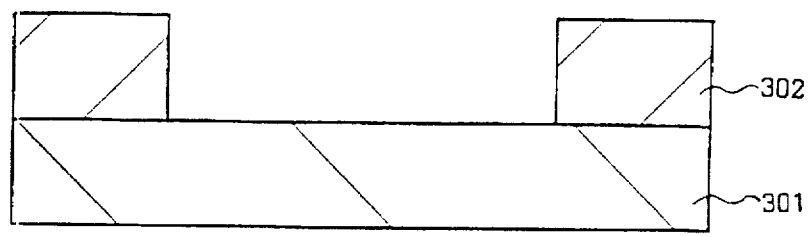
FIGS. 4A to 4D are cross-sectional views for explaining a method for fabricating an ohmic electrode according to a first embodiment of the invention.

In the first embodiment, first, as shown in FIG. 4A, a photoresist is applied on an $n^+$-type GaAs substrate 301, and then patterned by a photolithography method to make a resist pattern 302 having an opening in the area for the ohmic electrodes to be made. Exposure in the photolithography may use an optical exposure apparatus such as reduced projection exposure apparatus (so-called "stepper"). The resist pattern 302 may also be made by using an electron beam resist and an electron beam lithography method.

Figure 4B:
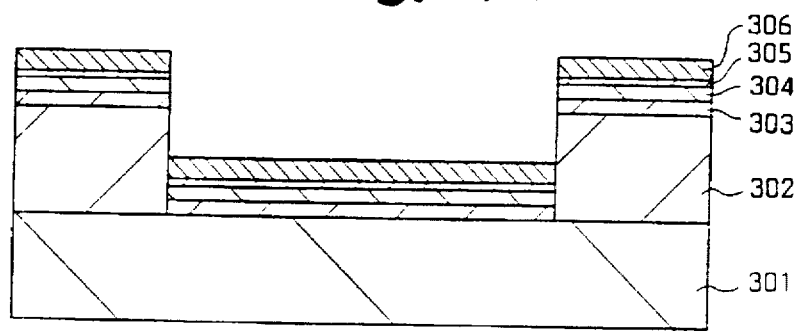

Next, as shown in FIG. 4B, a non-single crystal InAs layer 303 is first deposited on the entire surface by a sputtering method using, for example, InAs as the target (for example, magnetron sputtering method), and a Ni film 304, WSi film 305 and W film 306 are sequentially deposited by, for example, a sputtering method or an electron beam evaporation method. When a sputtering method such as a magnetron sputtering method is used to make the non-single crystal InAs layer 303, after evacuating the film making chamber to the base pressure of approximately $2 \times 10^{-5}$ Pa, Ar gas up to the pressure of approximately $3 \times 10^{-1}$ Pa is introduced to the chamber and DC-discharged. Power consumed for the discharge is, for example, 150 W. The film making temperature is, for example, room temperature. The film making speed is, for example, 7 nm/minute. The thickness of the resist pattern 302 is chosen to be amply larger than the total thickness of the non-single crystal InAs layer 303, Ni film 304, WSi film 305 and W film 306.

Figure 4C:
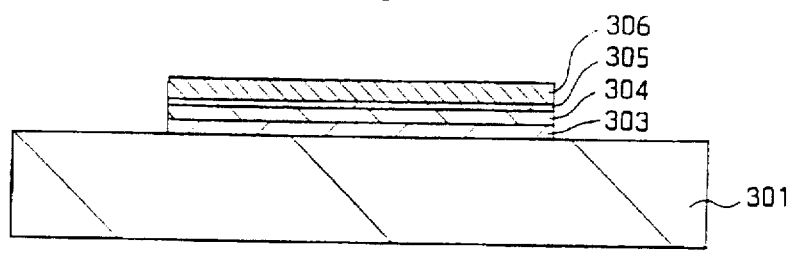

The $n^+$-type GaAs substrate 301 now having on it the non-single crystal InAs layer 303, Ni film 304, WSi film 305 and W film 306 is immersed in organic solvent, such as acetone, to solubly remove the resist pattern 302, hence causing the non-single crystal InAs layer 303, Ni film 304, WSi film 305 and W film 306 on the resist pattern 302 to be removed together. As a result, as shown in FIG. 4C, only selective part of the non-single crystal InAs layer 303, Ni film 304, WSi film 305 and W film 306 in the area corresponding to the opening of the resist pattern 302 remains on the $n^+$-type GaAs substrate 301.

Figure 4D:
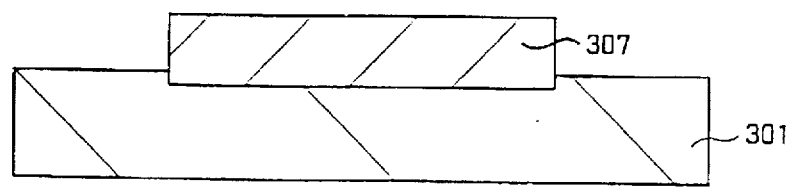

The $n^+$+-type GaAs substrate 301 having these non-single crystal InAs layer 303, Ni film 304, WSi film 305 and W film 306, i.e. the multi-layered structure for fabricating the ohmic electrode is then annealed, for example, by a typical electric furnace at, for example, 300° C. for 30 minutes, and subsequently annealed by an RTA (rapid thermal annealing) method or by using a typical electric furnace at, for example, 700° to 800° C. for several seconds to minutes. The melting point of the non-single crystal InAs layer 303 is about 942° C., and that of the $n^+$-type GaAs substrate 301 is about 1238° C., which are amply higher than the temperature applied during the annealing. The atmosphere used for the annealing may be composed of $N_2$ gas with or without an additional small amount of $H_2$ gas. As a result of the annealing, the ohmic electrode 307 as shown in FIG. 4D is obtained.

Analysis is now being made on details of the structure of the ohmic electrode 307 thus obtained. It has been recognized that part of the ohmic electrode 307 in contact with the $n^+$-type GaAs substrate 301 includes n-type crystalline $In_xGa_{1-x}As$ and crystalline NiAs. Mechanism of establishment of this structure by the annealing will be explained hereunder. By the first step annealing at, for example, 300° C. for 30 minutes, a $Ni_xGaAs$ layer is made on the $n^+$-type GaAs substrate 301, and a non-crystalline InAs layer containing a precipitate of NiAs is made on the $Ni_xGaAs$ layer. Formation of the $Ni_xGaAs$ layer results in removal of a native oxide film on the $n^+$-type GaAs substrate 301. By the second step annealing at, for example, 700° to 800° C. for several seconds or minutes, the non-single crystal InAs layer is crystallized due to epitaxial growth on the $n^+$-type GaAs substrate 301, which results in a crystalline InAs layer being made; and the crystalline InAs layer subsequently reacts with the $n^+$-type GaAs substrate 301, which results in the crystalline $In_xGa_{1-x}As$ layer being made. The crystalline $In_xGa_{1-x}As$ layer and the $n^+$-type GaAs substrate 301 are in lattice matching at least at a selective portion along the contacting interface between them. In the second step annealing, Si which is an impurity behaving as a donor is diffused to a high concentration from the WSi film 305 into the crystalline $In_xGa_{1-x}As$ layer, and so the crystalline $In_xGa_{1-x}As$ layer is changed to an n-type and decreased in resistance. Simultaneously with the formation of the crystalline $In_xGa_{1-x}As$ layer, the crystalline NiAs layer is formed on the $n^+$-type GaAs substrate 301. Si in the WSi film 305 is diffused also into the $n^+$-type GaAs substrate 301 and increases the impurity concentration at least in part of the $n^+$-type GaAs substrate 301 in contact with the ohmic electrode 307. It has been recognized that the top portion of the ohmic electrode 307 is composed of W.

Figure 5:
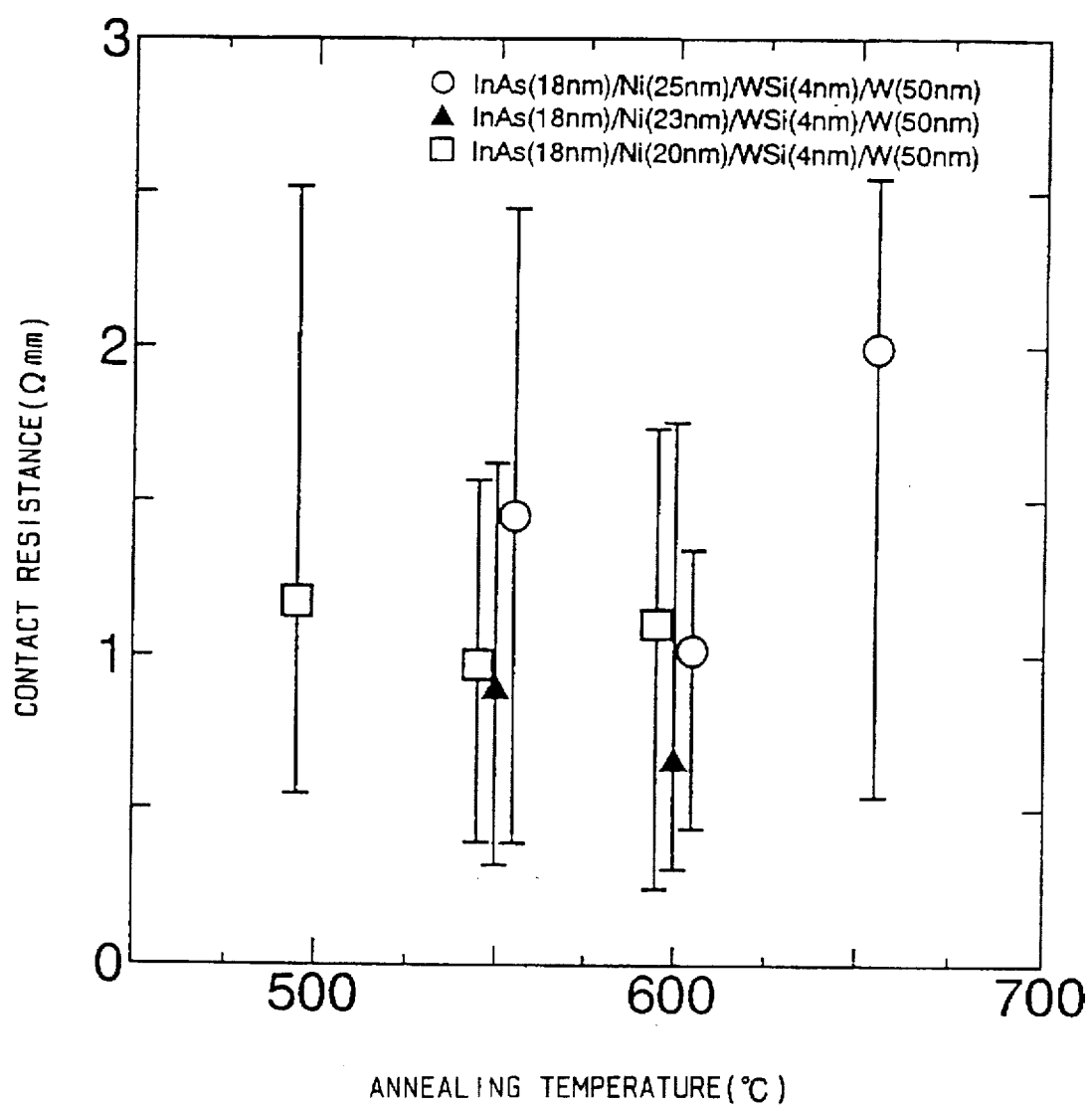
FIG. 5 is a graph showing changes in contact resistance with annealing temperatures obtained by measurement on ohmic electrodes fabricated by the fabricating method according to the first embodiment.

FIG. 5 shows measured contact resistances as a function of annealing temperatures, with regard to ohmic electrodes fabricated by using non-single crystal InAs layers 303, WSi films 305 and W films 306 having fixed thicknesses, namely, 18 nm, 4 nm and 50 nm, respectively, and Ni films 304 having different thicknesses, namely, 20 nm, 23 nm and 25 nm, and by first depositing the non-single crystal InAs layer 303, Ni film 304, WSi film 305 and W film 306, then annealing them at 300° C. for 30 minutes by a method using a typical electric furnace, and finally annealing them at different temperatures ranging from 495° C. to 650° C. for one second by the RTA method. The atmosphere used for the annealing was $N_2$ gas added with 5% of $H_2$ gas. $n^+$-type GaAs substrates 301 used were prepared by ion implanting Si into (100)-oriented semi-insulating GaAs substrates to change it to an n-type and its impurity concentration is $2 \times 10^{18} cm^{-3}$. Measurement of contact resistances was conducted by TLM (transmission line method). FIG. 5 describes that the contact resistance is lowest, about 1 Ωmm, at the annealing temperature of 600° C.

Figure 6:
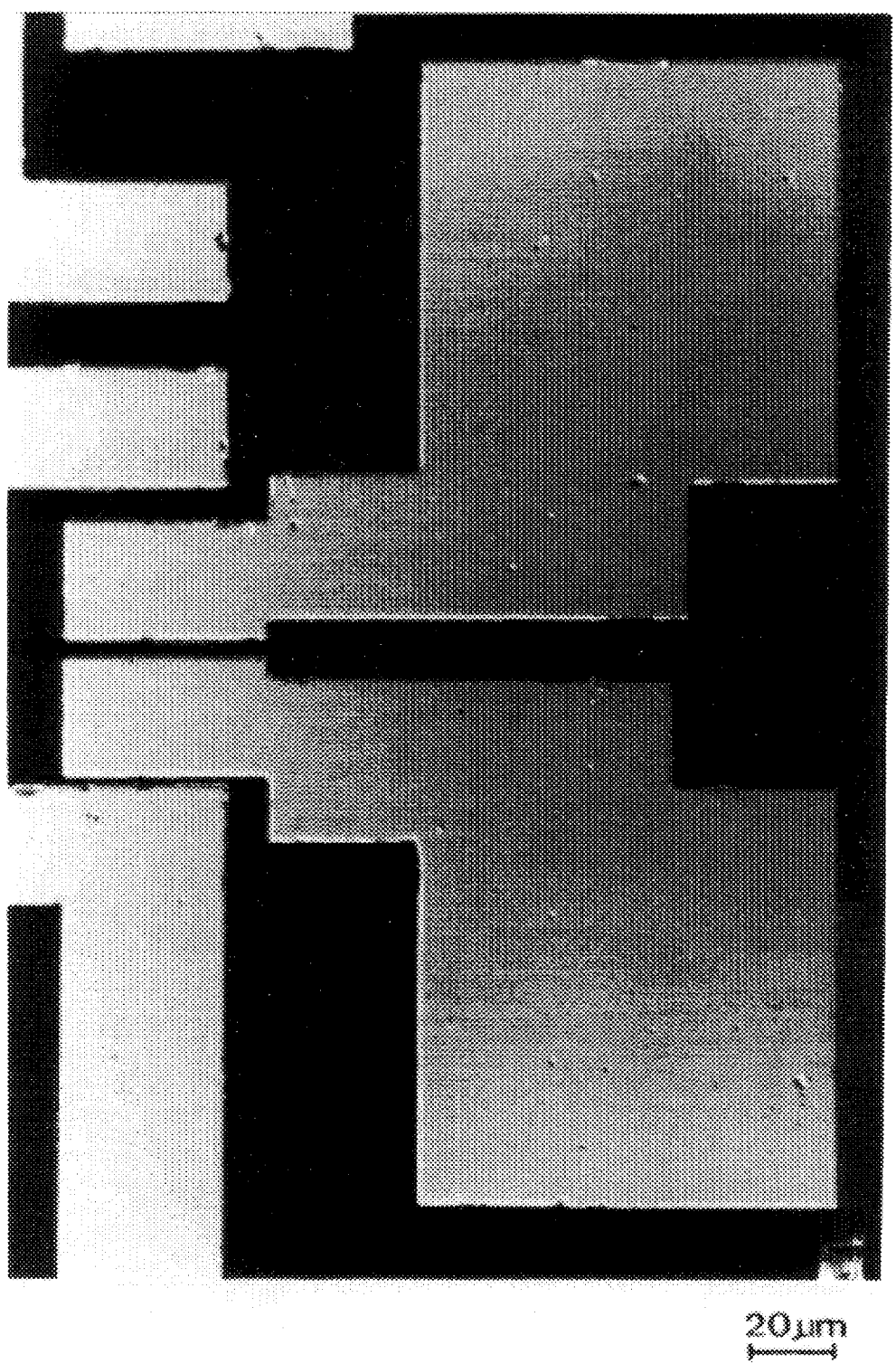
FIG. 6 is an optical micrograph of a multi-layered structure for fabricating ohmic electrodes, used in the fabricating method according to the first embodiment of the invention, immediately after deposition.

FIG. 6 is an optical micrograph of an aspect just after deposition of the multi-layered structure for fabricating ohmic electrodes composed of the non-single crystal InAs layer 303, Ni film 304, WSi film 305 and W film 306 which are 18 nm, 23 nm, 4 nm and 50 nm thick, respectively. FIG. 6 describes that the multi-layered structure for fabricating ohmic electrodes just after the formation has a very good morphology.

Figure 7:
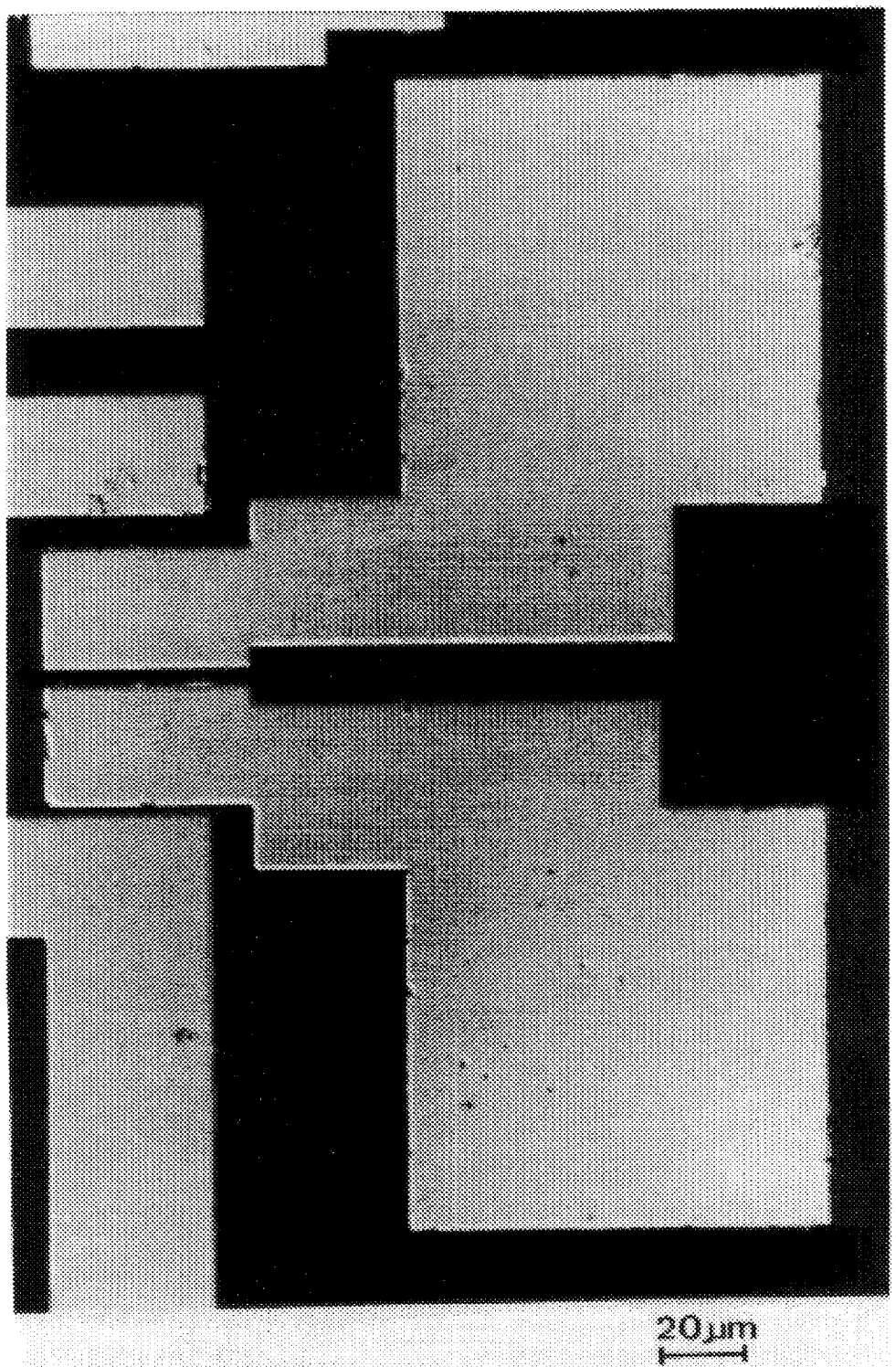
FIG. 7 is an optical micrograph of a multi-layered structure for fabricating ohmic electrodes annealed at 300° C. for 30 minutes after deposition in the fabricating method according to the first embodiment of the invention.

FIG. 7 is an optical micrograph of an aspect of the multi-layered structure for fabricating ohmic electrodes composed of the non-single crystal InAs layer 303, Ni film 304, WSi film 305 and W film 306 after being annealed at 300° C. for 30 minutes. FIG. 7 describes that the multi-layered structure for fabricating ohmic electrodes at this state also has a very good morphology.

Figure 8:
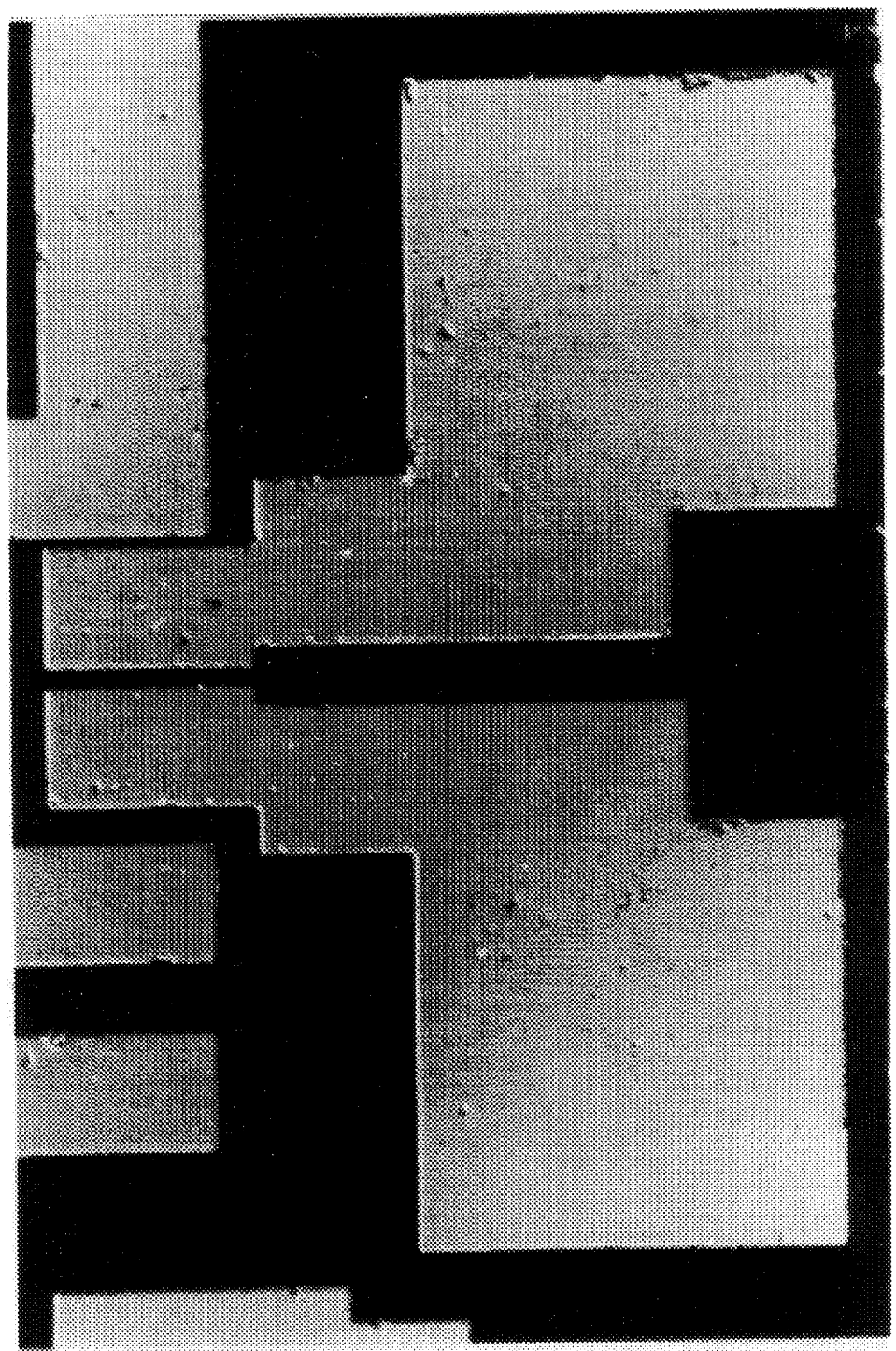
FIG. 8 is an optical micrograph of an ohmic electrode fabricated by making a multi-layered structure for fabricating ohmic electrodes, annealing at 300° C. for 30 minutes and then annealing at 650° C. for one second in the fabricating method according to the first embodiment of the invention.

FIG. 8 is an optical micrograph of an aspect of the ohmic electrode for fabricated by first making the multi-layered structure for fabricating ohmic electrodes composed of the non-single crystal InAs layer 303, Ni film 304, WSi film 305 and W film 306, then performing the first annealing at 300° C. for 30 minutes and finally performing a subsequent annealing at 650° C. for one second. FIG. 8 describes that the ohmic electrode thus made has quite a good morphology. The reason why such a good morphology is obtained is that the WSi film 305 prevents In of the non-single crystal InAs layer 303 from diffusing toward the electrode surface during the annealing. It is noteworthy that the WSi film 305, even as quite thin as 4 nm, effectively prevents diffusion of In.

Figure 9:
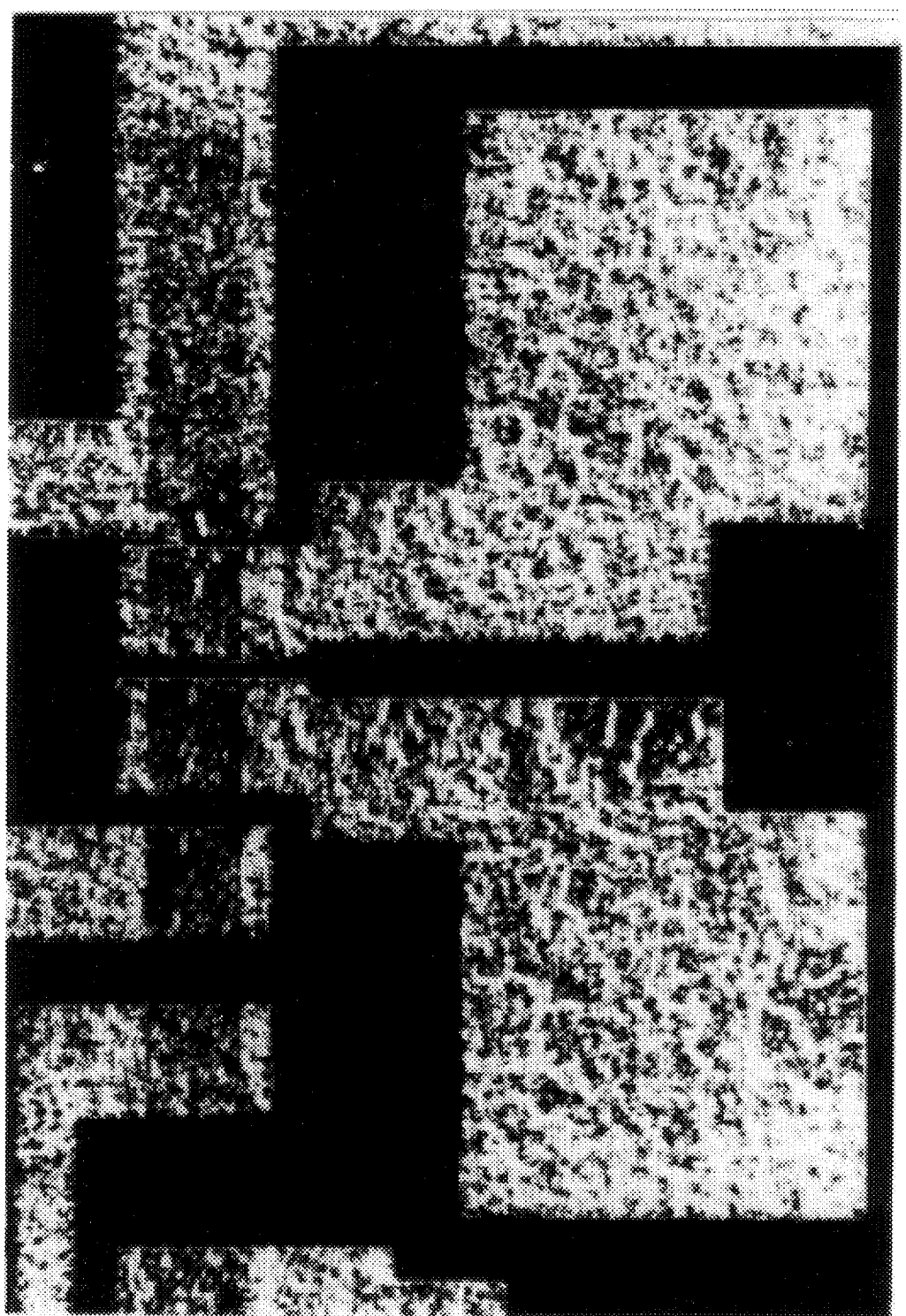
FIG. 9 is an optical micrograph of an ohmic electrode made by using a multi-layered structure for fabricating ohmic electrodes having an InAs/Ni/W structure.

FIG. 9 is an optical micrograph of an ohmic electrode, fabricated, for the purpose of comparison, by first making the multi-layered structure for fabricating ohmic electrodes in which a 23 nm thick non-single crystal InAs layer, 15 nm thick Ni film and 34 nm thick W film are sequentially stacked, then annealing the structure at 300° C. for 30 minutes, and finally annealing it at 700° C. for one second. FIG. 9 apparently describes that the ohmic electrode made by this method has a much worse morphology than that of FIG. 8 as a result of diffusion of In from the non-single crystal InAs layer toward the electrode surface.

By annealing a sample provided with the ohmic electrode 307 at 400° C. and by measuring change of contact resistance with time, i.e. its thermal stability, the ohmic electrode 307 has been confirmed to have a good thermal stability. The reason why such a good thermal stability is obtained is that the ohmic electrode 307 contains no compounds having low melting points, such as P-AuGa, which existing ohmic electrodes fabricated using AuGe/Ni inevitably contained.

Figure 1A:
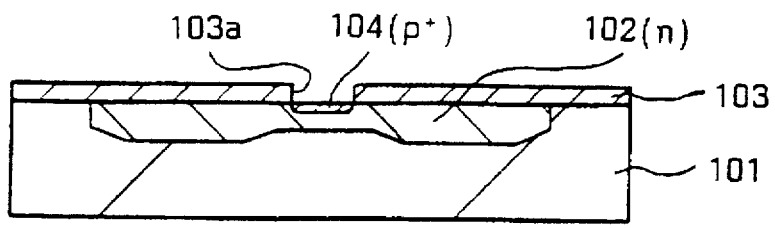
FIGS. 1A to 1E are cross-sectional views for explaining problems arising when an existing method for fabricating ohmic electrodes using AuGe/Ni as the ohmic electrode materials is employed for fabricating ohmic electrodes in a GaAs JFET fabricating process.
Figure 1B:
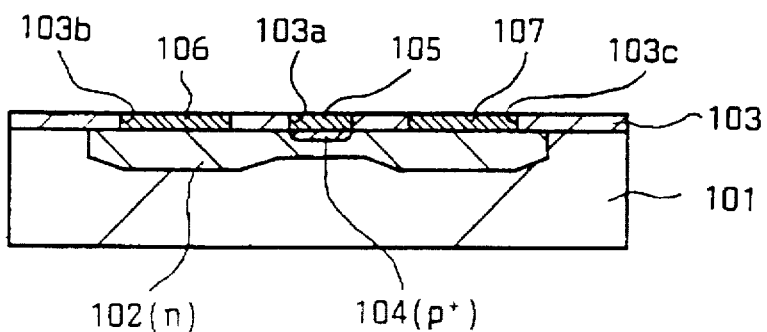
Figure 1C:
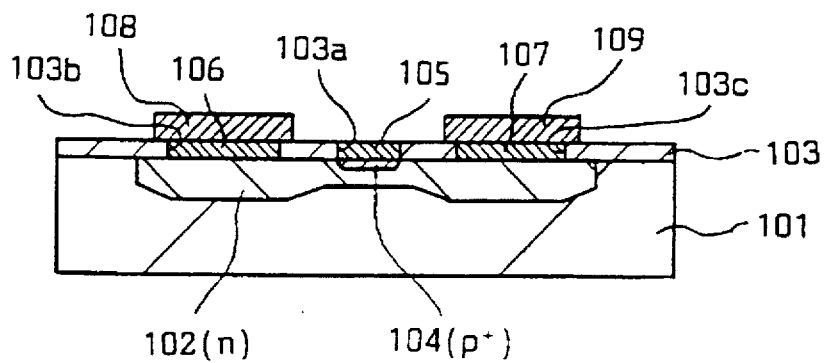
Figure 1D:
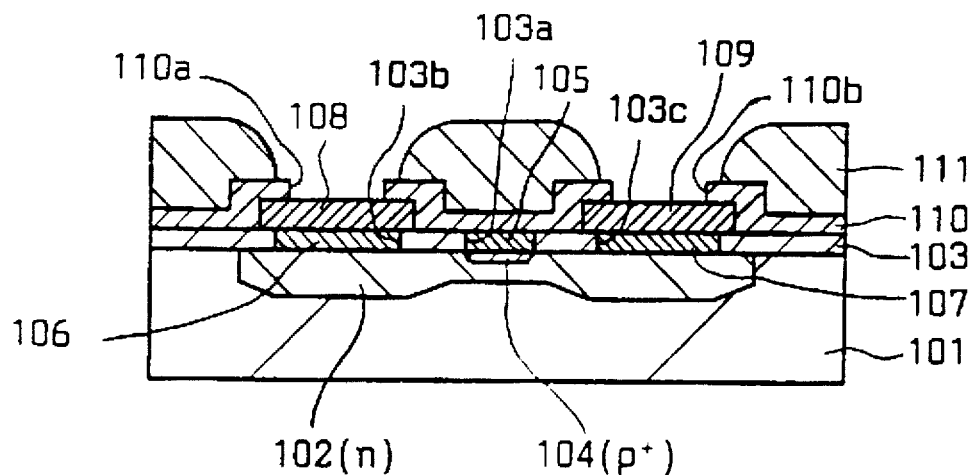
Figure 1E:
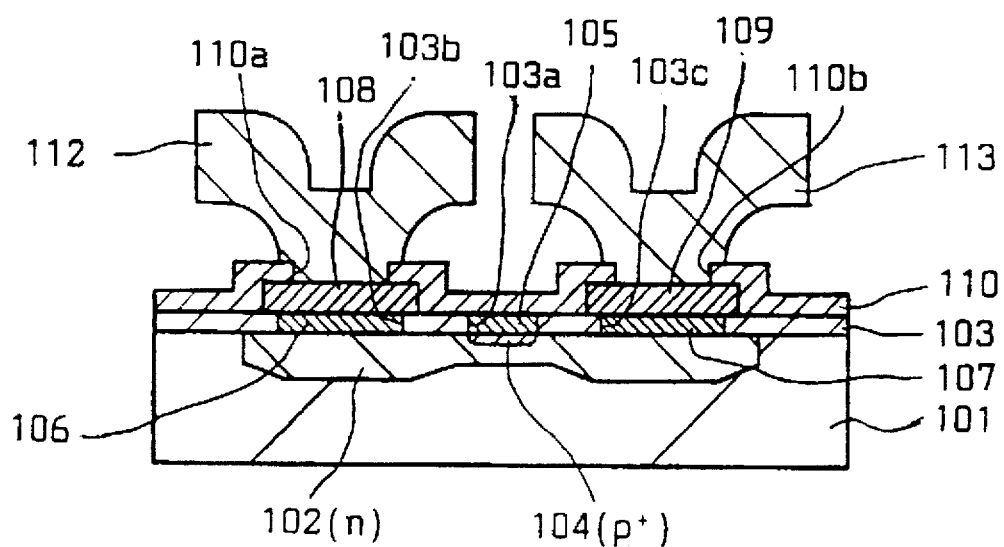
Figure 2:
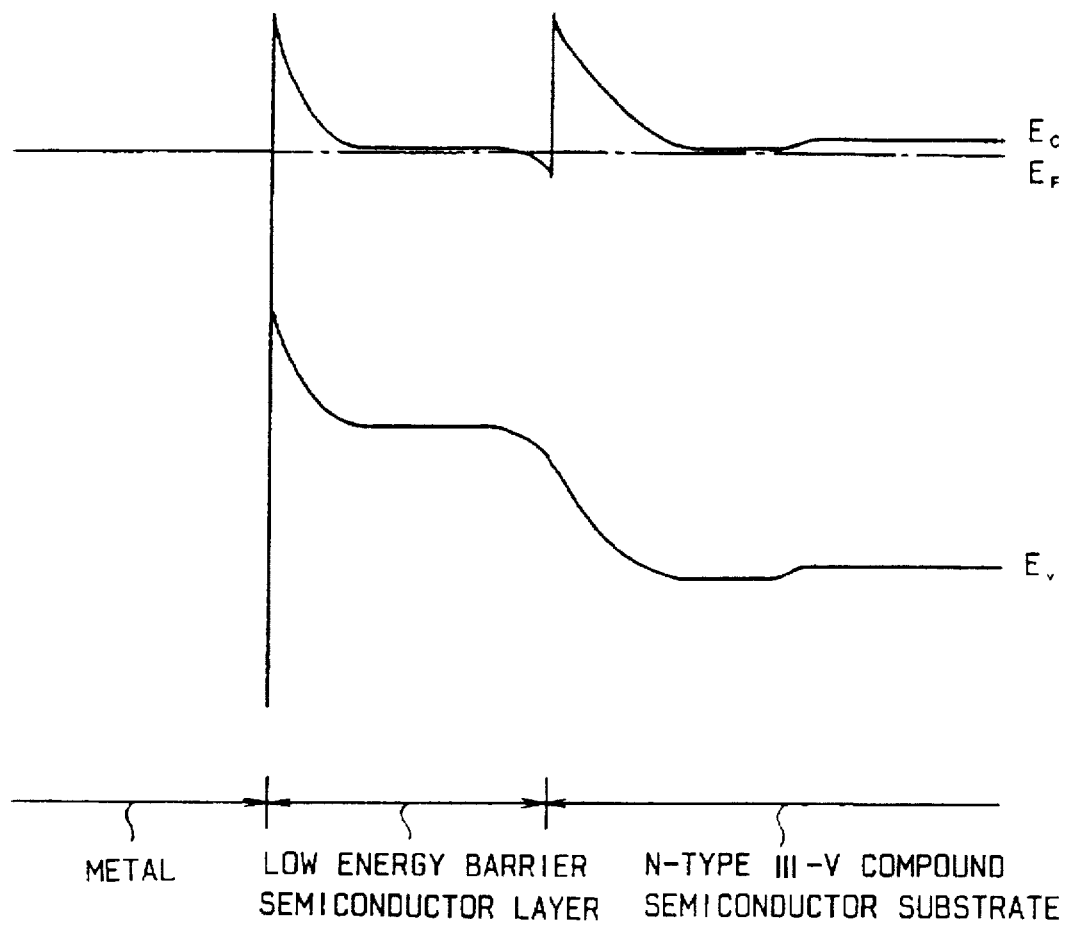
FIG. 2 is an energy band diagram of an ideal ohmic electrode.
Figure 3:
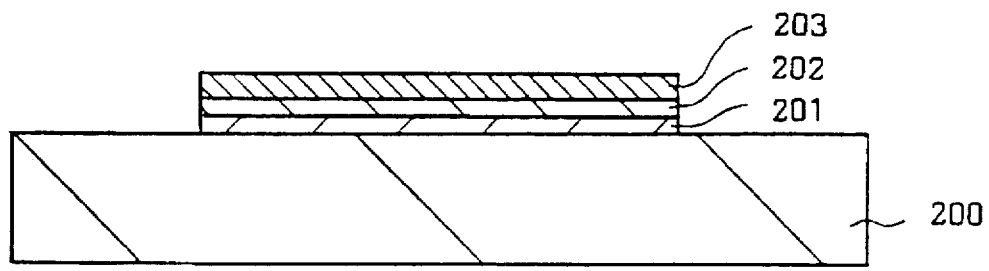
FIG. 3 is a cross-sectional view of a multi-layered structure for fabricating ohmic electrodes having an InAs/Ni/W structure used in the existing ohmic electrode fabricating method.

According to the foregoing first embodiment, since after the multi-layered structure for fabricating ohmic electrodes composing of a non-single crystal InAs layer 303, Ni film 304, WSi film 305 and W film 306 is made on an n$^+$-type GaAs substrate 301, the first step annealing at, e.g. 300° C. and the second step annealing at, e.g. 700° to 800° C. are conducted, the ohmic electrode 307 having has a low contact resistance, low film resistance, smooth surface, and good thermal stability. This ohmic electrode 307 has an energy band structure quite similar to the ideal one shown in FIG. 2. In addition, this ohmic electrode 307 permits direct connection of metal wiring without the need for a barrier metal, because its top layer is made of W which is a refractory metal. Furthermore, since the non-single crystal InAs layer 303 used to fabricate the ohmic electrode 307 is made by a sputtering method which can make a film at a high speed, a high productivity of ohmic electrodes is promised.

Next explained is a second embodiment of the invention.

Figure 10:
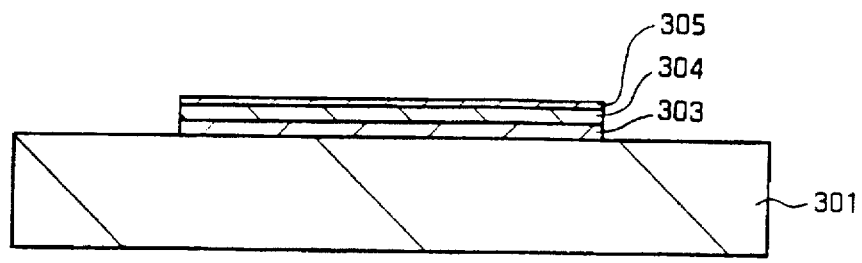
FIG. 10 is a cross-sectional view of a multi-layered structure for fabricating ohmic electrodes used in a method for fabricating ohmic electrodes according to a second embodiment of the invention.

The method for fabricating ohmic electrodes according to the second embodiment uses the multi-layered structure for fabricating ohmic electrodes shown in FIG. 10 in lieu of the one, as shown in FIG. 4C, used in the first embodiment. The multi-layered structure for fabricating ohmic electrodes shown in FIG. 10 is different from that of FIG. 4C in not having the W film 306. The other aspect of the second embodiment is the same as the first embodiment, and its explanation is omitted.

Also by the second embodiment, ohmic electrodes having substantially the same good characteristics as those by the first embodiment are obtained with ease and a high productivity.

Next explained is a third embodiment of the invention.

Figure 11:
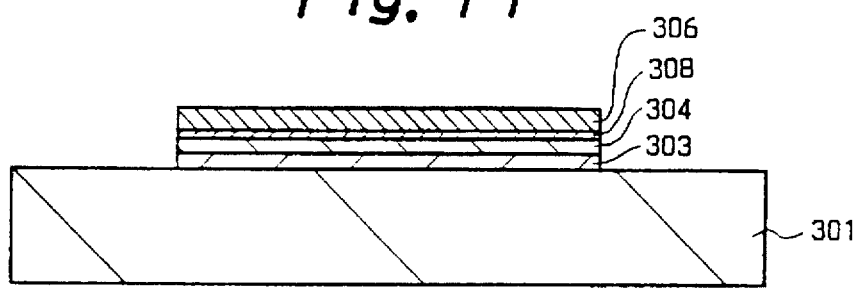
FIG. 11 is a cross-sectional view of a multi-layered structure for fabricating ohmic electrodes used in a method for fabricating ohmic electrodes according to a third embodiment of the invention.

The method for fabricating ohmic electrodes according to the third embodiment uses the multi-layered structure for fabricating ohmic electrodes shown in FIG. 11 in lieu of the one, as shown in FIG. 4C, used in the first embodiment. The multi-layered structure for fabricating ohmic electrodes shown in FIG. 11 is different from that of FIG. 4C in that a Ge film 308 comprising Ge as a donor impurity for the non-single crystal InAs layer 303 is made in lieu of the WSi film 305. Accordingly, during the annealing after deposition of the multi-layered structure for fabricating ohmic electrodes, Ge in the Ge film 308 is diffused into the non-single crystal InAs layer 303 and others. The other aspect of the third embodiment is the same as the first embodiment, and its explanation is omitted.

Also by the third embodiment, ohmic electrodes having substantially the same good characteristics as those by the first embodiment are obtained with ease and a high productivity.

Next explained is a fourth embodiment of the invention.

Figure 12:
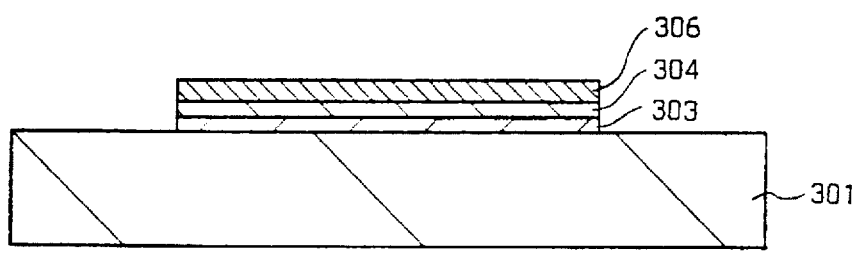
FIG. 12 is a cross-sectional view of a multi-layered structure for fabricating ohmic electrodes used in a method for fabricating ohmic electrodes according to a fourth embodiment of the invention.

The method for fabricating ohmic electrodes according to the fourth embodiment uses the multi-layered structure for fabricating ohmic electrodes shown in FIG. 12 in lieu of the one, as shown in FIG. 4C, used in the first embodiment. The multi-layered structure for fabricating ohmic electrodes shown in FIG. 12 is different from that of FIG. 4C in not including the WSi film 305 and instead containing one or more kinds of donor impurities such as Si, Ge Te, Sn, and so on, in the Ni film 304. Accordingly, during the annealing after deposition of the multi-layered structure for fabricating ohmic electrodes, donor impurities in the Ni film 304 are diffused into the non-single crystal InAs layer 303 and others. The other aspect of the fourth embodiment is the same as the first embodiment, and its explanation is omitted.

Also by the fourth embodiment, ohmic electrodes having substantially the same good characteristics as those by the first embodiment are obtained with ease and a high productivity.

Next explained is a fifth embodiment of the invention.

Figure 13:
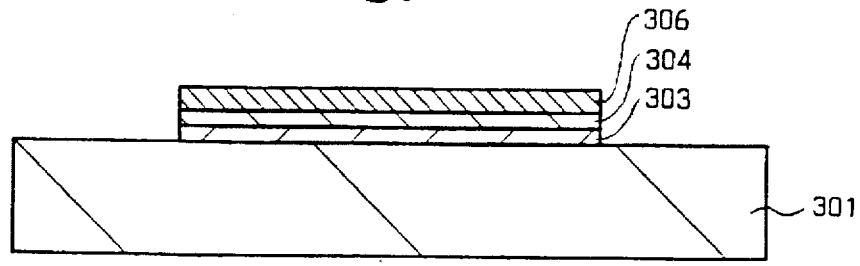
FIG. 13 is a cross-sectional view of a multi-layered structure for fabricating ohmic electrodes used in a method for fabricating ohmic electrodes according to a fifth embodiment of the invention.

The method for fabricating ohmic electrodes according to the fifth embodiment uses the multi-layered structure for fabricating ohmice electrodes shown in FIG. 13 in lieu of the one, as shown in FIG. 4C, used in the first embodiment. The multi-layered structure for fabricating ohmic electrodes shown in FIG. 13 is different from that of FIG. 4C in not including the WSi film 305 and instead preliminarily containing one or more kinds of donor impurities such as Si, Ge, Te, Sn, and so on, in the non-single crystal InAs layer 303. In this case, during the annealing after deposition of the multi-layered structure for fabricating ohmic electrodes, donor impurities contained in the non-single crystal InAs layer 303 come to be contained in the finally made crystalline In$_x$Ga$_{1-x}$As layer and change it to the n-type. The other aspect of the fifth embodiment is the same as the first embodiment, and its explanation is omitted.

Also by the fifth embodiment, ohmic electrodes having substantially the same good characteristics as those by the first embodiment are obtained with ease and a high productivity.

Next explained is a sixth embodiment of the invention. The sixth embodiment is directed to a process for manufacturing GaAs MESFETs which makes ohmic electrodes by using the ohmic electrode fabricating method according to the second embodiment and also makes gate electrodes simultaneously with the ohmic electrodes.

Figure 14A:
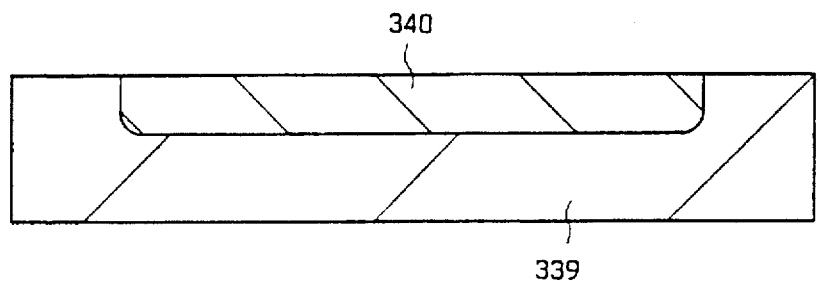
FIGS. 14A to 14D are cross-sectional views for explaining a method for fabricating a GaAs MESFET according to a sixth embodiment of the invention.

In the sixth embodiment, first, as shown in FIG. 14A, a semi-insulating GaAs substrate 339 is selectively ion-implanted with a donor impurity, and subsequently annealed to electrically activate the implanted impurity to provide an n-type channel layer 340.

Figure 14B:
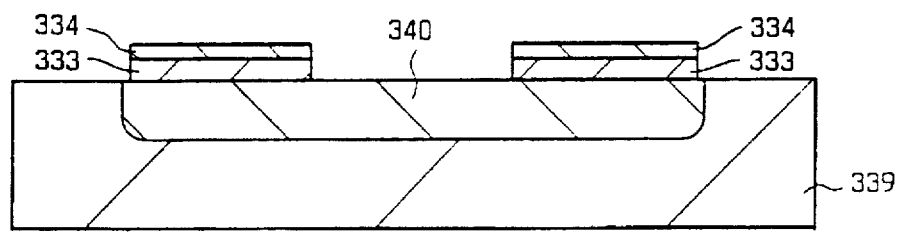

Next as shown in FIG. 14B, a multi-layered structure composed of the non-single crystal InAs layer 333 and the Ni film 334 is formed on the area for making the ohmic electrode by the lift-off method as referred to in the explanation of the first embodiment.

Figure 14C:
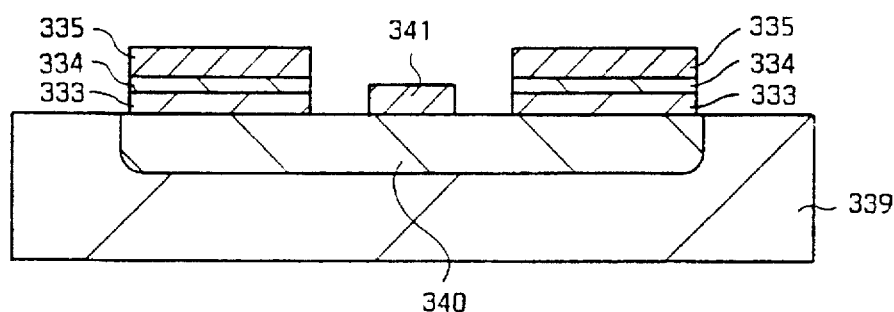

After that, a WSi film is deposited on the entire surface by, for example, a sputtering method, a resist pattern (not shown) in the form corresponding to the gate electrode and the ohmic electrode to be made is formed on the WSi film by a lithography method, the WSi film is etched by, for example, a reactive ion etching (RIE) method using the resist pattern as a mask and using a CF$_4$/O$_2$ etching gas, and the resist pattern is removed thereafter. As a result, as shown in FIG. 14C, the structure obtained includes, on its ohmic electrode making area, multi-layered structures for fabricating ohmic electrodes composed of the non-single crystal InAs layer 333, Ni film 334 and WSi film 335, and the gate electrode 341 composed of the WSi film. The WSi film may be used to make wiring.

Figure 14D:
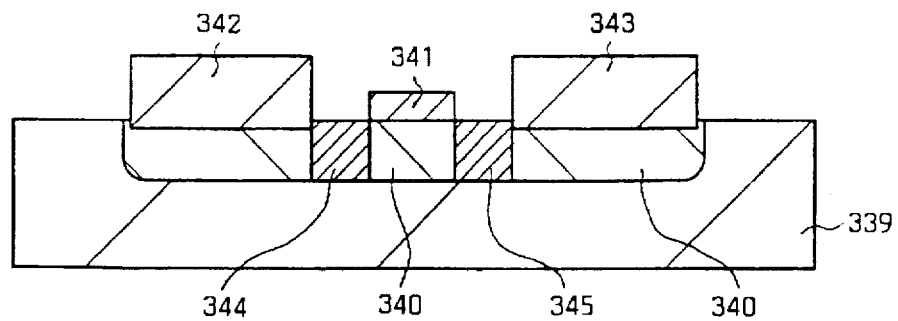

After that, by using the gate electrode 341 and the multi-layered structures for fabricating ohmic electrodes as a mask, a donor impurity is ion-implanted in the n-type channel layer 340 in a high concentration. Subsequently, annealing is conducted at a temperature enabling formation of the ohmic electrode and electrical activation of the implanted impurity, for example, 700° to 800° C. As a result, as shown in FIG. 14D in the same manner as explained with reference to the first embodiment, ohmic electrodes 342, 343 for use as either source or drain electrodes are made, and at the same time, n$^+$-type layers 344, 345 are made between the ohmic electrodes 342, 343 and the gate electrode 341 in the n-type channel layer 340 in self-alignment with the gate electrode 341 and the ohmic electrodes 342, 343. In this case, the n$^+$-type layer 344 formed in the n-type channel layer 340 between the ohmic electrode 342, as the source electrode, and the gate electrode 341 serves to reduce the series resistance between the source and the gate.

According to the sixth embodiment, the ohmic electrodes 342, 343 having good characteristics as source or drain electrodes can be made easily, and also the gate electrode 341 can be made simultaneously with formation of the multi-layered structures for fabricating ohmic electrodes used for fabricating ohmic electrodes 342, 343. As a result, the process for manufacturing GaAs MESFETs is simplified.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the Ni film 304, 334 used in the first to sixth embodiments may be replaced by a Co film.

Likewise, the Ge film 308 used in the third embodiment may be replaced by, for example, a Si film.

Further, although the first to fifth embodiments make the multi-layered structure for fabricating ohmic electrodes by a lift-off method, it may be made by first sequentially stacking the respective layers of the multi-layered structure for fabricating ohmic electrodes on the entire surface of the n$^+$-type GaAs substrate 301 and by subsequently patterning these layers into the form of ohmic electrodes by an etching method.

Furthermore, although the first to fifth embodiments have been explained as applying the invention to fabrication of ohmic electrodes onto the n$^+$-type GaAs substrate 301, the invention may also be applied to fabrication of ohmic electrodes onto an n$^+$-type GaAs layer made by epitaxial growth, for example.

As described above, by using the ohmic electrode fabricating method according to the invention, ohmic electrodes having practically satisfactory characteristics for III-V compound semiconductors can readily be fabricated with a high productivity.

The multi-layered structure for fabricating ohmic electrodes according to the invention facilitates fabrication of ohmic electrodes having practically satisfactory characteristics for III-V compound semiconductors.

What is claimed is:

1. A method for fabricating an ohmic electrode, comprising the steps of:

sequentially stacking on a III-V semiconductor body, a non-single crystal semiconductor layer and a film of a metal or an intermetallic compound, at least one of said non-single crystal semiconductor layer and said film including an impurity behaving as a donor at least for said non-single crystal semiconductor layer, and the energy barrier between said non-single crystal semiconductor layer and said film being lower than the energy barrier between said III-V compound semiconductor body and said film: and annealing said III-V compound semiconductor body provided with said non-single crystal semiconductor layer and said film wherein said film comprises a metal film and a refractory metal silicide film provided on said metal film.

2. The method for fabricating an ohmic electrode according to claim 1 wherein said non-single crystal semiconductor layer is made by a sputtering method.

3. The method for fabricating an ohmic electrode according to claim 1 wherein said non-single crystal layer and said film are made by a sputtering method.

4. The method for fabricating an ohmic electrode according to claim 1 wherein said III-V compound semiconductor body is of the n-type.

5. The method for fabricating an ohmic electrode according to claim 1 wherein said III-V compound semiconductor body and said non-single crystal semiconductor layer have melting points not lower than 900° C.

6. The method for fabricating an ohmic electrode according to claim 1 wherein said III-V compound semiconductor body comprises GaAs, AlGaAs or InGaAs.

7. The method for fabricating an ohmic electrode according to claim 1 wherein said non-single crystal semiconductor layer is a non-single crystal InAs layer or a non-single crystal InGaAs layer.

8. The method for fabricating an ohmic electrode according to claim 1 wherein a refractory metal film is further provided on said refractory metal silicide film.

9. The method for fabricating an ohmic electrode according to claim 1 wherein said metal film is a Ni film or a Co film, and said refractory metal silicide film is a WSi film.

10. The method for fabricating an ohmic electrode according to claim 8 wherein said refractory metal film is a W film.

11. A method for fabricating an ohmic electrode, comprising the steps of:

sequentially stacking on a III-V semiconductor body, a non-single crystal semiconductor layer and a film of a metal or an intermetallic compound, at least one of said non-single crystal semiconductor layer and said film including an impurity behaving as a donor at least for said non-single crystal semiconductor layer, and the energy barrier between said non-single crystal semiconductor layer and said film being lower than the energy barrier between said III-V compound semiconductor body and said film: and annealing said III-V compound semiconductor body provided with said non-single crystal semiconductor layer and said film, wherein said non-single crystal semiconductor layer contains an impurity behaving as a donor at least for said non-single crystal semiconductor layer, and said film comprises a metal film and a refractory metal film provided on said metal film.

12. The method for fabricating an ohmic electrode according to claim 11 wherein said metal film is a Ni film or a Co film, and said refractory metal film is a W film.

13. The method for fabricating an ohmic electrode according to claim 1 wherein said impurity comprises at least one element chosen from the group consisting of Si, Ge, Te and Sn.

14. The method for fabricating an ohmic electrode according to claim 1 wherein the temperature of said annealing is not higher than 900° C.

15. The method for fabricating an ohmic electrode according to claim 1 wherein the annealing step comprises a first annealing step at 200° to 400° C. and a second annealing at 500° to 900° C.

16. A method for fabricating an ohmic electrode, comprising the steps of:

sequentially stacking on a III-V compound semiconductor body, a non-single crystal semiconductor layer and a film of a metal or an intermetallic compound, said non-single crystal semiconductor layer including an impurity behaving as a donor at least for said non-single crystal semiconductor layer, and wherein the energy barrier between said non-single crystal semiconductor layer and said film being lower than the energy barrier between said III-V compound semiconductor body and said film; and annealing said III-V compound semiconductor body provided with said non-single crystal semiconductor layer and said film.

17. The method for fabricating an ohmic electrode according to claim 11, wherein said non-single crystal semiconductor layer is made by a sputtering method.

18. The method for fabricating an ohmic electrode according to claim 11, wherein said non-single crystal layer and said film are made by a sputtering method.

19. The method for fabricating an ohmic electrode according to claim 11, wherein said III-V compound semiconductor body is of the n-type.

20. The method for fabricating an ohmic electrode according to claim 11, wherein said III-V compound semiconductor body and said non-single crystal semiconductor layer have melting points not lower than 900° C.

21. The method for fabricating an ohmic electrode according to claim 11, wherein said III-V compound semiconductor body comprises GaAs, AlGaAs or InGaAs.

22. The method for fabricating an ohmic electrode according to claim 11, wherein said non-single crystal semiconductor layer is a non-single crystal InAs layer or a non-single crystal InGaAs layer.

23. The method for fabricating an ohmic electrode according to claim 16, wherein said non-single crystal semiconductor layer is made by a sputtering method.

24. The method for fabricating an ohmic electrode according to claim 16, wherein said non-single crystal layer and said film are made by a sputtering method.

25. The method for fabricating an ohmic electrode according to claim 16, wherein said III-V compound semiconductor body is of the n-type.

26. The method for fabricating an ohmic electrode according to claim 16, wherein said III-V compound semiconductor body and said non-single crystal semiconductor layer have melting points not lower than 900° C.

27. The method for fabricating an ohmic electrode according to claim 16, wherein said III-V compound semiconductor body comprises GaAs, AlGaAs or InGaAs.

28. The method for fabricating an ohmic electrode according to claim 16, wherein said non-single crystal semiconductor layer is a non-single crystal InAs layer or a non-single crystal InGaAs layer.

29. The method for fabricating an ohmic electrode according to claim 11, wherein said refractory metal film is a W film.

30. The method for fabricating an ohmic electrode according to claim 11, wherein said impurity comprises at least one element chosen from the group consisting of Si, Ge, Te and Sn.

31. The method for fabricating an ohmic electrode according to claim 11, wherein the temperature of said annealing is not higher than 900° C.

32. The method for fabricating an ohmic electrode according to claim 11, wherein the annealing step comprises a first annealing step at 200° to 400° C. and a second annealing at 500° to 900° C.

33. The method for fabricating an ohmic electrode according to claim 16, wherein the annealing step comprises a first annealing step at 200° to 400° C. and a second annealing at 500° to 900° C.

34. A method for fabricating an ohmic electrode, comprising the steps of:

sequentially stacking on a III-V compound semiconductor body, a non-single crystal semiconductor layer and a film comprised of a metal film and a refractory metal silicide film; and annealing said III-V compound semiconductor body provided with said non-single crystal semiconductor layer and said film.

35. The method for fabricating an ohmic electrode according to claim 34, wherein said film is comprised of a refractory metal on said refractory metal silicide film.

36. A method for fabricating an ohmic electrode, comprising the steps of:

sequentially stacking on a III-V compound semiconductor body, a non-single crystal semiconductor layer and a film of a metal or an intermetallic compound, said non-single crystal semiconductor including an impurity behaving as a donor; and annealing said III-V compound semiconductor body provided with said non-single crystal semiconductor layer and said film.

37. The method for fabricating an ohmic electrode according to claim 34, wherein said non-single crystal semiconductor layer is made by a sputtering method.

38. The method for fabricating an ohmic electrode according to claim 34, wherein said non-single crystal layer and said film are made by a sputtering method.

39. The method for fabricating an ohmic electrode according to claim 34, wherein said III-V compound semiconductor body is of the n-type.

40. The method for fabricating an ohmic electrode according to claim 34, wherein said III-V compound semiconductor body and said non-single crystal semiconductor layer have melting points not lower than 900° C.

41. The method for fabricating an ohmic electrode according to claim 34, wherein said III-V compound semiconductor body comprises GaAs, AlGaAs or InGaAs.

42. The method for fabricating an ohmic electrode according to claim 34, wherein said non-single crystal semiconductor layer is a non-single crystal InAs layer or a non-single crystal InGaAs layer.

43. The method for fabricating an ohmic electrode according to claim 36, wherein said non-single crystal semiconductor layer is made by a sputtering method.

44. The method for fabricating an ohmic electrode according to claim 36, wherein said non-single crystal layer and said film are made by a sputtering method.

45. The method for fabricating an ohmic electrode according to claim 36, wherein said III-V compound semiconductor body is of the n-type.

46. The method for fabricating an ohmic electrode according to claim 36, wherein said III-V compound semiconductor body and said non-single crystal semiconductor layer have melting points not lower than 900° C.

47. The method for fabricating an ohmic electrode according to claim 36, wherein said III-V compound semiconductor body comprises GaAs, AlGaAs or InGaAs.

48. The method for fabricating an ohmic electrode according to claim 36, wherein said non-single crystal semiconductor layer is a non-single crystal InAs layer or a non-single crystal InGaAs layer.

49. The method for fabricating an ohmic electrode according to claim 34, wherein the temperature of said annealing is not higher than 900° C.

50. The method for fabricating an ohmic electrode according to claim 34, wherein the annealing step comprises a first annealing step at 200° to 400° C. and a second annealing at 500° to 900° C.

51. The method for fabricating an ohmic electrode according to claim 36, wherein said impurity comprises at least one element chosen from the group consisting of Si, Ge, Te and Sn.

52. The method for fabricating an ohmic electrode according to claim 36, wherein the temperature of said annealing is not higher than 900° C.

53. The method for fabricating an ohmic electrode according to claim 36, wherein the annealing step comprises a first annealing step at 200° to 400° C. and a second annealing at 500° to 900° C.

54. The method for fabricating an ohmic electrode according to claim 16 wherein said impurity comprises at least one element chosen from the group consisting of Si, Ge, Te and Sn.

55. The method for fabricating an ohmic electrode according to claim 16, wherein the temperature of said annealing is not higher than 900° C.

* * * * *